United States Patent [19]

Young et al.

[11] Patent Number: 4,636,983

[45] Date of Patent: Jan. 13, 1987

[54] MEMORY ARRAY BIASING CIRCUIT FOR HIGH SPEED CMOS DEVICE

[75] Inventors: Kenneth E. Young, Newark; Bruce L. Bateman, San Jose, both of Calif.

[73] Assignee: Cypress Semiconductor Corp., San Jose, Calif.

[21] Appl. No.: 683,062

[22] Filed: Dec. 20, 1984

[51] Int. Cl.$^4$ .............................................. G11C 11/40
[52] U.S. Cl. .................................. 365/181; 365/189; 365/190
[58] Field of Search .............. 365/190, 154, 156, 181, 365/174, 189; 307/296 R, 297

[56] References Cited

U.S. PATENT DOCUMENTS 4,433,393  2/1984  Oritani ................................. 365/190
4,516,225  5/1985  Frederick ......................... 307/296 R Primary Examiner—Terrell W. Fears
Attorney, Agent, or Firm—Owen, Wickersham & Erickson

[57] ABSTRACT

A current limiting, process compensating circuit for CMOS memory arrays is provided. A dual transistor bias circuit is connected to each of a pair of columns of the array with a four transistor voltage reference circuit having its output connected to the gates of the active P-channel transistor of each bias circuit. A first P-channel transistor of the voltage reference circuit is sized to be less than the P-channel transistor of the bias circuit and the other three N-channel transistors are sized to be the same as the second transistor of the bias circuit and the two transistors of each memory cell in the array. As supply voltage to the array moves up or down making more or less current available, the combined circuit maintains nearly constant current on the first transistor of each bias circuit while compensating for process variation.

6 Claims, 6 Drawing Figures

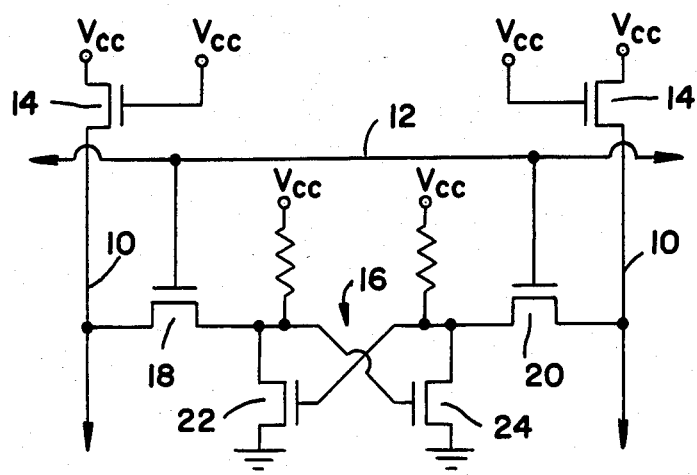
FIG_1 (PRIOR ART)
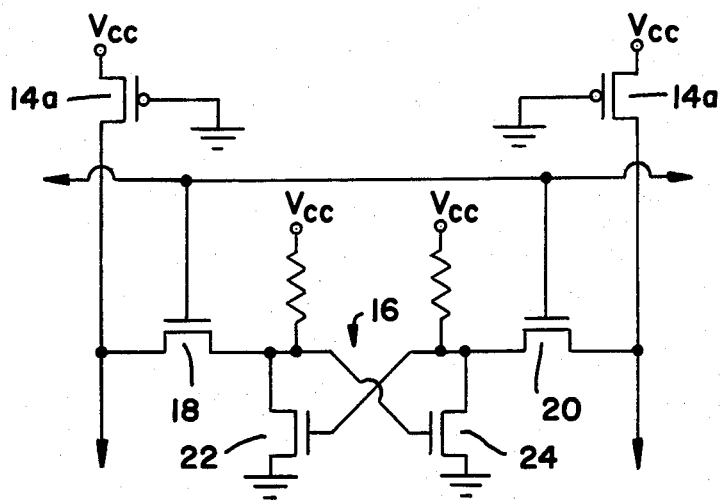
FIG_2 (PRIOR ART)
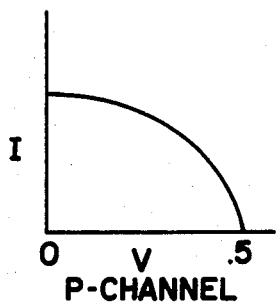
FIG_3
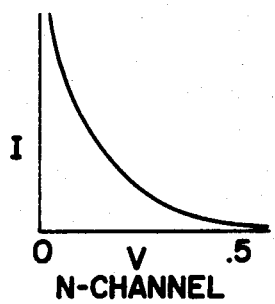
FIG_4
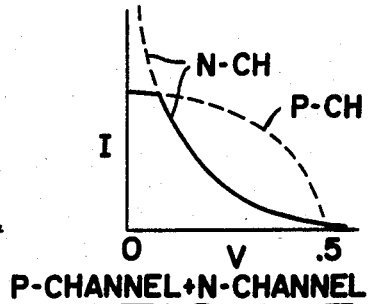
FIG_5

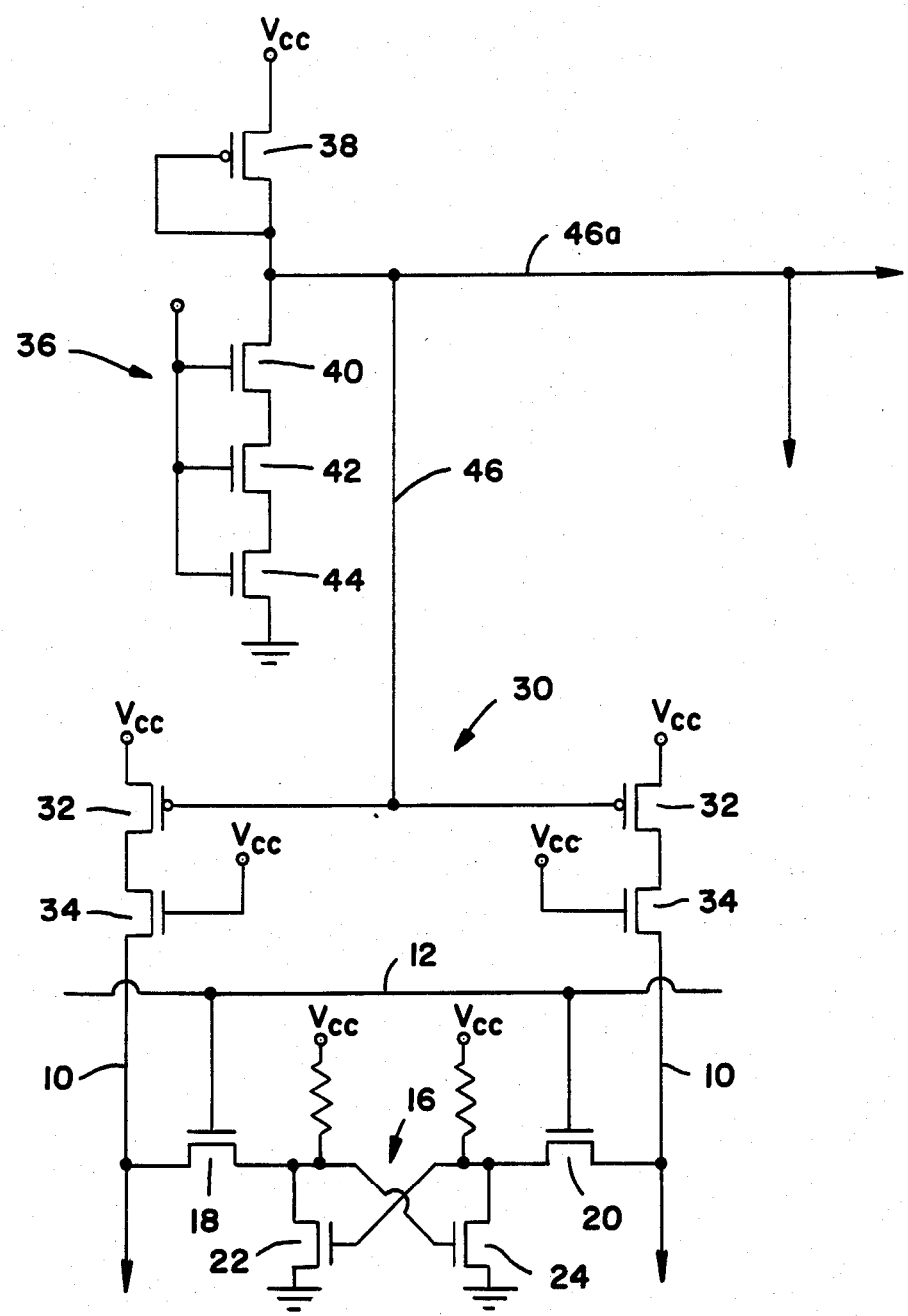
FIG_6

MEMORY ARRAY BIASING CIRCUIT FOR HIGH SPEED CMOS DEVICE

This invention relates generally to semiconductors and more particularly to complementary semiconductor structures with reduced power consumption characteristics.

BACKGROUND OF THE INVENTION

In the design and development of semiconductor devices an important consideration has long been to reduce the operating power required and thereby also reduce related problems of temperature, apparatus size and other factors. With complementary or CMOS semiconductor devices, power is essentially consumed only during a change of state of a gate or cell and thus, power requirements for large CMOS arrays are relatively low as compared with P-channel or N-channel devices. However, in prior CMOS devices, such as large memory arrays, excessive power was consumed and current flow variations occurred during certain functions of the circuit, due to several factors. In the fabrication processing of CMOS devices, inherent processing differences are created between P-channel and N-channel elements of the array. Such process differences or variations may occur due to a number of factors such as: (1) the gate oxide thickness, a critical parameter in the strength of the circuit elements or transistors; (2) electrical W or width of the transistor; (3) the poly-L of the transistor which is the distance between its drain and source as laid out in the circuit; and (4) impurity doping concentration in the channel of the transistor. Heretofore, these process differences caused mismatching between elements that resulted in variations of and excessive current flow through related devices, thereby causing excessive power consumption and sometimes malfunctioning of the circuit.

Another problem with prior CMOS memory devices, particularly those utilizing a single N-channel transistor as a bias means for each bit line or column, was that the bias transistors inherently drew excessive current as they were pulled up to prebias the bit lines of the memory device to a predetermined voltage. The present invention provides a means for eliminating this excessive current flow to thereby decrease the overall power consumption for the memory devices while also compensating for the aforesaid process variation.

SUMMARY AND OBJECTS OF THE INVENTION

In accordance with the invention, a multitransistor bias circuit is provided for each bit line of a column pair of a CMOS semiconductor memory array. Each bias circuit, comprised of a P-channel transistor and an N-channel transistor in series, is connected to the chip voltage source and to the end of a bit line. This bias circuit operates so that the current reaches a maximum level and is limited as the voltage is pulled to ground, as for example, during the "write" mode for the memory device. The gate of the P-channel transistor is connected to a self-compensating voltage reference circuit comprised of four series connected MOS transistors. The first transistor of the series is a P-channel transistor whose drain is connected to the voltage source. It is smaller in electrical size than the active P-channel transistor of the bias circuit and functions to provide an offset voltage. The other three transistors of the reference circuit are N-channel transistors and are sized, respectively, the same as the N-channel load element of the bias circuit and two transistors that form a memory cell of the array, such as a cross-coupled static Ram memory cell. Thus, the output of the reference voltage circuit varies as a function of the current being drawn by the three reference circuit elements in series. Although the amount of current being drawn by these three reference elements varies as a function of process variation, the source voltage Vcc and temperature, any change in the characteristic of a main circuit element is mirrored in the reference circuit elements. Thus, in the operation of the device, the voltage from the reference circuit moves up or down accordingly, making more or less current available to the memory array by changing the gate bias on the active P-channel element of each bias circuit. This automatic compensation maintains a constant current flowing through each P-channel bias element for every bit column in the memory array and for all of the described variations that may occur in the operation of the semiconductor device.

It is therefore one object of the invention to provide an improved CMOS memory device that operates with less power consumption that comparable prior art devices.

Another object of the invention is to provide a CMOS memory device that maintains precise bias voltage levels on bit line pairs so that the device will operate more efficiently and be less susceptible to noise.

Another object of the invention is to provide a CMOS memory device that overcomes mismatching of circuit elements caused by processing variations.

Still another more specific object of the invention is to provide an improved CMOS memory device with a dual transistor bias means for each bit line or column in combination with a voltage reference circuit that together provides both current limiting and compensation for process variations between circuit elements.

Other objects, advantages and features of the invention will become apparent from the following detailed description of one embodiment thereof, presented in conjunction with the accompanying drawing.

BRIEF DESCRIPTION OF THE DRAWING

FIG. 1 is a circuit diagram showing a portion of a semiconductor memory array using a biasing arrangement of the prior art;

FIG. 2 is a circuit diagram showing a portion of a semiconductor memory array using another biasing arrangement of the prior art;

FIG. 3 is a typical current/voltage saturation curve for a P-channel MOS device.

FIG. 4 is a typical current/voltage saturation curve for an N-channel MOS device FIG. 5 is a current/voltage curve for a bias circuit comprised of P-channel and N-channel devices connected in series.

FIG. 6 is a circuit diagram showing a portion of a semiconductor memory array using bias circuits connected to a voltage reference circuit according to the present invention.

DETAILED DESCRIPTION OF EMBODIMENT

With reference to the drawing, FIGS. 1 and 2 show fragments of typical CMOS memory arrays as heretofore fabricated. For each array comprising N number of bit lines or columns 10 and M number of crossing word lines 12, a biasing or pullup transistor element is provided whose drain is connected to the chip voltage source (Vcc). In the arrangment of FIG. 1, the gate of each biasing transistor element 14, which is an N-channel transistor, is also connected to the Vcc voltage supply.

Between the pairs of columns, which are bit and bit lines, are connected memory cells 16, with each cell being also connected to a word line 12 of the array. In the example shown, a poly load, four transistor cross-coupled static ram memory cell 16 is shown, comprised of two transistors 18 and 20 each being connected to a column 10 and their gates connected to a word line 12. A pair of cross-coupled transistors 22 and 24 are each connected in series with one of the transistors 18 and 20 respectively, but the gates of transistors 22 and 24 are cross connected to the other transistors 20 and 18, respectively. When either (but not both) of the bit lines of a pair connected to a memory cell is pulled towards ground, the state of the cross-coupled latch can be changed from "0" to "1" or vice versa. Here, the N-channel pullup transistors 14 serve to bias the bit lines, but they have the process variation and excessive current disadvantages previously discussed. In this circuit the amount of current flowing from Vcc through N-channel device of one column continues to increase as that column is pulled closer to ground. This current is free to increase with Vcc, temperature and process variation, resulting in greater power consumption for the circuit and causing it to be more sensitive to circuit functionality.

In the prior art memory circuit shown in FIG. 2, the pullup or bias transistor is a P-channel device 14a with its gate connected to ground instead of to Vcc and the same memory cells 16 are used. Although use of this single P-channel bias device will limit the current for the nominal Vcc processing case, a major disadvantage of this prior art circuit was that it offered no form of process compensation. Since the gate voltage for the transistor 14a is tied to ground, this P-channel device always operates in full saturation load. Therefore, as Vcc varies and the device process varies (as previously described) the amount of current that's used by the memory array will increase or decrease with process variations, but will not remain constant. Further, the biasing scheme of FIG. 2, included a fundamental device mismatch between the N-channel devices 18 and 22 of the memory array and the P-channel biasing transistor 14a. This mismatch is inherent in the processing differences between the P-channel and N-channel devices in a CMOS process and can result in functionality or timing problems over Vcc, temperature or process variations. This circuit would also result in more current flowing through device 14a than in the biasing scheme of the present invention due to no compensation for Vcc, temperature or process variation.

In fundamental MOS technology, P-channel and N-channel transistors have different voltage/current characteristics, as illustrated in FIGS. 3 and 4. FIG. 3 shows a typical transfer curve for current (I) versus bias voltage (V) of a P-channel device. As indicated, at zero voltage, the current is at its maximum level and then falls off to zero conduction at the threshold voltage. FIG. 4 shows the same type of curve for an N-channel or enhancement device, but here the current increases rapidly as voltage approaches zero or is pulled downward towards ground. Thus, it is seen that when a single N-channel transistor is used as a bias means for bit lines (as in FIG. 1), a relatively large current flow occurs as each transistor is pulled to ground especially during the "write" mode operation of the memory circuit.

Now, if a P-channel transistor and an N-channel transistor are connected in series between a voltage supply (Vcc) and the end of a bit line, the voltage/current curve appears as the solid line in FIG. 5. In effect this respresentative curve, which results from an overlay of the individual P-channel and N-channel curves, shows that the large current surge at low voltage is essentially cut off at the P-channel maximum voltage level. As the source (or bit line voltage) of this dual transistor pair pulls toward ground, the current is controlled initially by the N-channel device, but as the P-channel device comes into saturation the current clips off and limits itself instead of continuing much higher as it would normally do for an N-channel device (as shown by the dotted lines). The present invention takes advantage of the overlay current/voltage characteristics of the series connected P-channel and N-channel transistor pair.

Turning now to FIG. 6, a fragmentary portion of an integrated circuit memory array 30 of a typical CMOS memory device embodying principles of the present invention is shown. In this array, column (or column bit and bit bar) lines 10 and crossing word lines 12 are provided with a plurality of standard memory cells 16 each connected to a pair of column lines and to a word line in the conventional manner. Each memory cell, as previously described with reference to FIGS. 1 and 2, is a crosscoupled static ram cell comprised of the four N-channel transistors 18, 20 and 22, 24. Now, instead of a single bias transistor for each column, a pair of P-channel and N-channel transistors 32 and 34 forming a bias circuit are provided. The first transistor 32 of this bias circuit, a P-channel device, has its drain connected to the Vcc power source and its source connected to the N-channel transistor 34 whose source is connected to a column of the array and whose gate is also connected to Vcc power. The gate of the P-channel transistor in every bias circuit is connected to the output of a voltage reference circuit 36. Although in FIG. 6, the P-channel transistor 32 is shown connected to Vcc and the N-channel transistor 34 is connected to the bit line, the positions of these two transistors could be reversed without changing the function of either device or the overall operation of the bias circuit.

The voltage reference 36 circuit is comprised of four MOS transistors 38, 40, 42 and 44 which are source/drain connected in series. The first transistor 38 is a P-channel MOS device whose drain is connected to the supply voltage Vcc. The size of this P-channel transistor 38 is less than the P-channel transistor 32 of the bias circuits and thus it provides an offset voltage reference. The source of the transistor 38 is connected to its gate and to the drain of the next transistor 40, and also, via a Vref lead 46, to the gates of the two P-channel transistors 32 of a pair of bias circuits for a column pair. Branch leads 46a extend from lead 46 to all the other column pairs of the memory array and are connected to the P-channel transistors 32 of the respective bias circuits in a similar manner. For very large arrays, additional and separate but similar voltage reference circuits may be provided to accommodate circuit layout requirements. In accordance with the invention, the transistors 40, 42 and 44 of the reference circuit are N-channel devices, and they are sized to be the same as the N-channel transistor 34 of the bias circuit and N-channel transistors 18 and 22 of the memory cell circuit 16, respectively. The source of transistor 44 is connected to ground and the gates of all three transistors 40, 42 and 44 of the voltage reference circuit are connected to the Vcc power source.

The present invention provides both current limiting and thus less power consumption as well as compensation for process variations in a CMOS integrated circuit memory device. In the operation of a CMOS memory device, the bit lines are normally biased for the "read" mode, that is, at Vcc minus VT, which is standard N-channel only type configuration. In so far as power consumption is concerned, the amount of current being drawn in the read mode is not significant. The more critical concern is how much does current go up when the circuit goes into the "write" mode, that is, when one of the two bit lines is pulled towards ground in order to change the state of the memory cell. When one of the two bit lines is pulled towards ground, increased current is drawn through the column bias or pullup circuit. With the P-channel and N-channel transistors 32 and 34 providing the current/voltage characteristic as shown in FIG. 5, the current is "clipped" as voltage is pulled to ground and excessive power consumption is avoided. Precise operation of the bias circuit and the memory cells is enhanced by the voltage reference circuit 36 which compensates for process variations. For example, as process variations occur causing the P-channel transistor of the voltage reference circuit to get stronger or weaker in relation to te N-channel elements, this increase or decrease in strength is mirrored into the P-channel device 32 of each bias circuit. This automatically strengthens or weakens the amount of current which is possible to be passed through the P-channel bias circuit device into the memory.

As the memory circuit functions such as in a "write" mode operation, when either bit line of a pair (but not both) is pulled towards ground, the state of the cross-coupled memory cell 16 can be changed. Pulling either bit line towards ground results in more current being pulled through the P-channel and N-channel devices 32 and 34. However, the P-channel device 32 first current limits then reduces current as its bit line is being pulled nearer ground, speeding up the fall time of the bit line and limiting the current flowing through the series pair to nearly the same amount of current over Vcc, temperature and process variation, due to the effect of the voltage reference circuit.

In summary, the reference voltage (Vref) produced by the circuit 36 varies as a function of the current being drawn by the three transistors 40, 42 and 44 in series. Since the amount of current being drawn by transistor elements 34, 18 and 22 in series varies as a function of the entire device CMOS process, the supply voltage Vcc and device temperature, this variation or change is mirrored in the N-channel devices 40, 42, and 44 of the voltage reference circuit. Thus, the voltage moves up or down accordingly, making more or less current available to the memory array by changing the gate bias on the P-channel transistor 32. This automatic compensation keeps a nearly constant current flowing through the P-channel transistor device 32 in each bias circuit of the memory array over all of the described variations.

To those skilled in the art to which this invention relates, many changes in construction and widely differing embodiments and applications of the invention will suggest themselves without departing from the spirit and scope of the invention. The disclosures and the descriptions herein are purely illustrative and are not intended to be in any sense limiting.

What is claimed is:

1. In a CMOS integrated circuit device, a memory array and control circuitry therefor comprising:
   a plurality of pairs of columns;
   a plurality of word lines;
   a plurality of multi-transistor memory cells, each cell including a pair of cross-coupled N-channel transistors and being at an intersection of and connected to a pair of columns and to one said word line; bias means connected to one end of each said column, said bias means including a P-channel transistor and an N-channel transistor connected source/drain in series between a supply voltage input and one said column, each said bias means serving to limit the current drain to the threshold level of said P-channel transistor as the column for the particular bias means is pulled toward ground; and
   a voltage reference circuit connected to said supply voltage input and having an output connected to the gates of said P-channel transistors for each said pair of bias means connected to a pair of columns, said reference circuit providing compensation means for reducing the effects of process variations between elements of said device.

2. The integrated circuit device of claim 1 wherein said voltage reference circuit comprises a P-channel transistor having its drain connected to a voltage supply and its source connected to first, second and third N-channel transistors source drain connected in series, said P-channel transistor being equal to or smaller in size than said P-channel transistor of said bias means, said first N-channel transistor being equal in size to said N-channel transistor of said bias means, and said second and third N-channel transistors being equal in size to said N-channel transistors of said memory cells.

3. The integrated circuit device of claim 1 wherein each said memory is a cross-coupled latch circuit comprised of four N-channel transistors.

4. In a CMOS integrated circuit device, a memory array and control circuitry therefor comprising:
   a plurality of pairs of columns, each pair constituting a bit line and a bit bar line;
   a plurality of word lines extending transverse to said pairs of columns;
   a plurality of multi-transistor memory cells, each cell being located at an intersection of and connected to one word line and one pair of columns;
   bias means connected to one end of each said column, each said bias means including a P-channel transistor source/drain and an N-channel transistor source/drain connected in series between a supply voltage input and one said column, each said bias means being operative for limiting the current drain to the threshold level of said P-channel transistor as the connected column for the particular bias means is pulled toward ground;
   and a voltage reference circuit having an output connected to the gates of the P-channel transistors for the bias means of column pairs, said reference circuit having transistor elements sized to mirror transistor elements of said bias means and said memory cells and thereby compensate for process variations within said device.

5. The circuit device according to claim 4 wherein said voltage reference circuit is comprised of a first P-channel transistor having its drain connected to a source voltage and three source/drain connected N- channel transistors connected to the source of said first P-channel transistor.

6. The circuit device according to claim 4 wherein the size of said first P-channel transistor is less then the P-channel transistor of each said bias means, and said N-channel transistors are equal in size to the N-channel transistor of said bias means and to two N-channel transistors comprising each said memory cell in said device.

* * * * *